United States Patent [19]

Ishibashi et al.

[11] Patent Number: 5,171,718
[45] Date of Patent: Dec. 15, 1992

[54] METHOD FOR FORMING A FINE PATTERN BY USING A PATTERNED RESIST LAYER

[75] Inventors: Akira Ishibashi, Kanagawa; Yoshifumi Mori, Chiba; Kenji Funato, Kanagawa, all of Japan

[73] Assignee: Sony Corporation, Tokyo, Japan

[21] Appl. No.: 639,325

[22] Filed: Jan. 9, 1991

Related U.S. Application Data

[63] Continuation of Ser. No. 275,755, Nov. 23, 1988, abandoned.

[30] Foreign Application Priority Data

| Nov. 27, 1987 | [JP] | Japan | 62-299405 |
| Nov. 27, 1987 | [JP] | Japan | 62-299406 |
| Jan. 22, 1988 | [JP] | Japan | 63-012104 |
| Jan. 22, 1988 | [JP] | Japan | 63-012105 |
| Mar. 9, 1988 | [JP] | Japan | 63-055549 |
| Mar. 18, 1988 | [JP] | Japan | 63-064854 |

[51] Int. Cl.$^5$ .......................................... H01L 21/312
[52] U.S. Cl. .................................... 437/229; 437/935; 437/944; 148/DIG. 100; 148/DIG. 131; 148/DIG. 137
[58] Field of Search ............... 437/229, 935, 944; 148/DIG. 131, DIG. 137, DIG. 100

[56] References Cited

U.S. PATENT DOCUMENTS

| 3,997,367 | 12/1976 | Yau | 437/913 |
| 4,197,332 | 4/1980 | Broers et al. | |
| 4,440,804 | 4/1984 | Milgram | 437/944 |
| 4,514,233 | 4/1985 | Kawabuchi | 437/249 |
| 4,523,976 | 6/1985 | Bukhman | 437/229 |
| 4,566,937 | 1/1986 | Pitts | |
| 4,634,496 | 1/1987 | Mase et al. | 437/228 |
| 4,771,017 | 9/1988 | Tobin et al. | 148/DIG. 100 |
| 4,803,181 | 2/1989 | Buchmann et al. | 437/229 |

FOREIGN PATENT DOCUMENTS

| 0077445 | 4/1983 | European Pat. Off. |
| 0171068 | 2/1986 | European Pat. Off. |
| 3015034A1 | 10/1981 | Fed. Rep. of Germany |
| 3231457 | 3/1984 | Fed. Rep. of Germany |
| 56-122143 | 9/1981 | Japan |
| 63-122122 | 5/1988 | Japan |

OTHER PUBLICATIONS

Translation of DE 30 15 034 A1–Fritzsche.
A. N. Broers et al., "Electron-beam Fabrication of 80 Å Metal Structures" *Applied Physics Letters,* vol. 29, No. 9, Nov. 1976 pp. 596-598.
Morrissey et al., Electron-Beam Contamination as a Mask, IBM Technical Disclosure Bulletin, vol. 20, No. 6, Nov., 1977, p. 2212.
Manufacture of Semiconductor Device, Patent Abstracts of Japan, vol. 10, No. 150 (E-408) [2207], May 31, 1986.

*Primary Examiner*—Brian E. Hearn
*Assistant Examiner*—Laura M. Holtzman
*Attorney, Agent, or Firm*—Hill, Van Santen, Steadman & Simpson

[57] ABSTRACT

A fine pattern formation using an electron beam induced resist, and use of the resist in making semiconductor devices are disclosed. Collimated electron beam is irradiated and scanned along a desired pattern on a layer on which a resist layer of a desired pattern is deposited under an atmosphere containing a starting material layer for the resist. The resist thus deposited is partially removed by reactive ion etching to remove the skirt like portion of the resist layer, or totally removed by reactive ion etching during or after processing by using the resist layer as a processing mask. Since the resist layer width is determined by a diameter of the collimated electron beam, line width of less than hundred Å can be directly drawn. There are also disclosed processes using the resist layer in manufacturing semiconductor devices.

15 Claims, 9 Drawing Sheets

METHOD FOR FORMING A FINE PATTERN BY USING A PATTERNED RESIST LAYER

This a continuation of application Ser. No. 275,755, filed Nov. 23, 1988, abandoned.

BACKGROUND OF THE INVENTION

The present invention relates to a method for forming a fine pattern by using a patterned resist layer and a process to use the patterned resist layer in manufacturing semiconductor devices.

Heretofore, for producing fine structures such as large scale integrated circuits (LSI), a so-called photolithography using light has been employed predominantly. However, in the production of fine structures of several hundred Å even if far infrared rays are used, they are too coarse by a factor of ten and it is difficult even by the use of X-rays. That is, for producing a fine structure, of several hundreds Å, a resolution less than that is necessary and, accordingly, it is necessary that the wavelength is less than several hundreds Å. This is the region of X-rays and there are various problems to be solved at present in view of both the X-ray source and the mask material.

On the other hand, patterning by using electron beams has begun to be used recently as a substituent method. FIG. 1 and FIG. 2 show examples thereof.

FIG. 1 shows a case using a positive type resist, in which a positive type resist 2 is coated on a substrate 1 (refer to FIG. 1A), and then patterning is applied for the resist 2 by the electron beam exposure 5 and development (refer to FIG. 1B) Then, a pattern forming material 3 is deposited to form on the entire surface (refer to FIG. 1C), and then the resist 2 is lifted-off together with the pattern-forming material 3 thereover to form the pattern-forming material 3 in a predetermined pattern on the substrate 1 (refer to FIG. 1D).

FIG. 2 shows a case of using a negative type resist, in which a pattern forming material 3 is formed on a substrate 1 and a negative type resist 4 is deposited to form further thereover (refer to FIG. 2A) and patterning is applied for the resist 4 by electron beam exposure 5 and development (refer to FIG. 2B). Then, the pattern-forming material 3 is selectively etched by using the resist 4 as a mask to apply patterning for the pattern-forming material 3 (refer to FIG. 2C). Then, the resist 4 is removed (refer to FIG. 2D).

In the patterning method using the electron beams as described above, it is adapted for both of the positive and negative resists that a desired pattern is obtained by previously coating the resist to several thousands Å and then changing the resist material by the electron beam exposure. The starting material for forming the pattern which is the final object in this case is a solid resist, which acts as multiple scattering material to incident electron beams. In this case, as shown, for example, by Wilkinson, et al. (Superlattices and Microstructures, Vol. 2, No. 6, 1986), traces of electrons as shown in FIG. 3A and FIG. 3B are expected. FIG. 3A shows a trace for scattered 100 electrons after applying electron beam 13 at 50 KV to a resist layer 12 of 0.3 μm thickness formed on an Si substrate 11 of 5 μm thickness, while FIG. 3B shows the trace of electrons after applying electron beam 13 at 10 KV to the same specimen.

As can be seen from the figure, due to the multiple scattering of electrons in the resist, their initial spacial resolution is lost during passage through the resist. It is particularly fatal in the negative type resist. In addition, due to the backward scattering electrons from the substrate, the electrons also strike the resist in other places. The drawing shows an Si substrate and the effect is increased in GaAs substrates, etc. Accordingly, since the portion through which the electrons have past is exposed inevitably, all of them hinder the production of microstructures.

As a method of forming a pattern, it has been known to dispose a substrate in a gas atmosphere containing constituent materials such as either a metal or a semiconductor material and to use irradiating electron beams at a desired portion on the surface of the substrate, thereby depositing metal or semiconductor material in a predetermined pattern on the substrate (refer to Japanese Patent Laid Open Publication No. Sho 62-42417). It has also been known to dispose a substrate in a gaseous resist atmosphere and to direct irradiating electron beams at the surface of the substrate to thereby deposit a resist of a desired pattern (refer to Applied Physics Letters. Vol. 29, No. 9, 1978; p 596–598).

Though the deposition technique of resist shown in the above literature is generally known, there is no recognition how to utilize the technique in manufacturing the semiconductor devices, because there is no suitable technique to remove the resist and trim the shape of the resist.

Further in the conventional photolithography as described above, it is possible to completely cover a pattern 22 of a trapezoidal cross section formed on a semiconductor substrate 21 with a resist 23 as shown in FIG. 4A. However, as shown in FIG. 4B, in the case of a pattern 22 of an inverted trapezoidal cross section, in which shadows are present when viewed from the incident direction of the exposure rays, the resist 23 can be formed only on the upper surface thereof and it is difficult to cover the entire surface of the pattern 22 with the resist 23. Accordingly, when isotropic etching is applied subsequently, the pattern 22 is etched from the portion not covered with the resist 23 and, as a result, the initially patterned shape can not be kept. This problem is not restricted only to the case of the pattern 22 of the inverted trapezoidal section as shown in FIG. 4B, but it is always brought about generally in the case of patterns having portions forming shadows when viewed from one direction.

OBJECT AND SUMMARY OF THE INVENTION

Accordingly, it is an object of the present invention to provide a method for forming a fine pattern by using a patterned resist layer.

It is another object of the present invention to provide a method for forming a fine pattern, in which a patterned resist layer shape is trimmed precisely as desired.

It is further object of the present invention to provide a method for forming a fine pattern, in which a patterned resist layer is removed easily.

It is still further object of the present invention to provide a method for forming a fine pattern in which a patterned resist layer is used as a mask to process a semiconductor substrate.

It is yet further object of the present invention to provide a method for forming a fine pattern by using a patterned resist layer in a self-align process in manufacturing semiconductor devices.

According to one aspect of the present invention, there is provided a method for forming a fine pattern by using a patterned resist layer which comprises the steps of placing a substrate having a layer on which a patterned resist layer is to be formed in an evacuated chamber, said chamber containing a starting material gas to be deposited on said layer as a desired resist pattern, directing a collimated charged particle ray on said layer and scanning along said desired pattern to form said patterned resist layer induced from said starting material gas, processing by using said patterned resist layer as a processing mask, and removing said patterned resist layer by reactive ion etching. The resist layer is used as etching mask, deposition mask and so on.

DESCRIPTION OF THE PREFERRED EMBODIMENTS

Figure 1A:
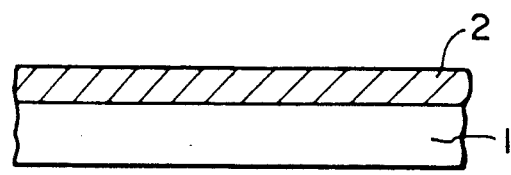
FIGS. 1A to 1D and 2A to 2D show conventional processes forming patterns using electron beam sensitive resist materials.
Figure 1B:
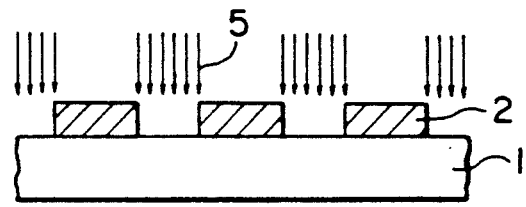
Figure 1C:
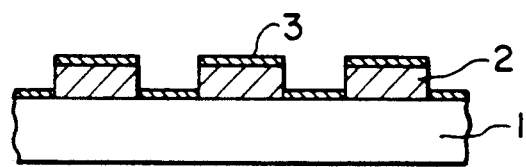
Figure 1D:
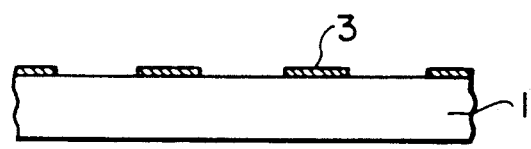
Figure 2A:
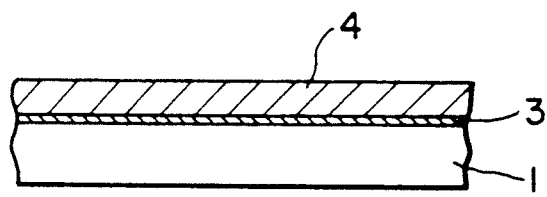
Figure 2B:
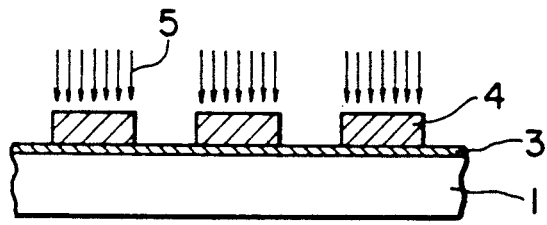
Figure 2C:
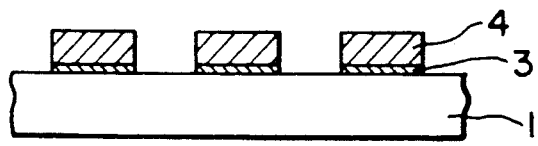
Figure 2D:
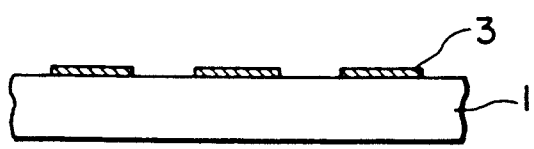
Figure 3A:
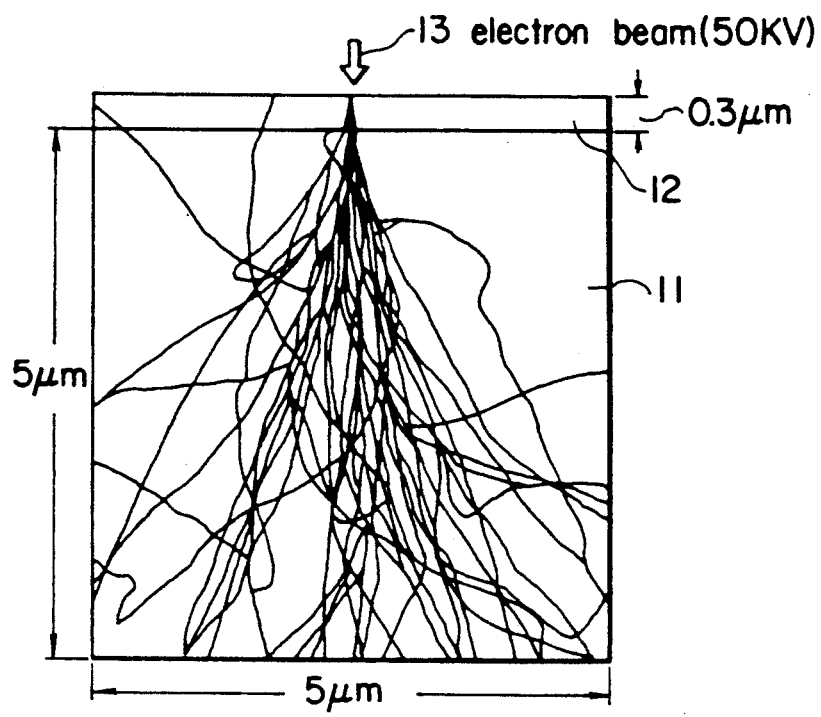
FIGS. 3A and 3B show the manner of electron scattering during exposure of the resist layer to the electron beam.
Figure 3B:
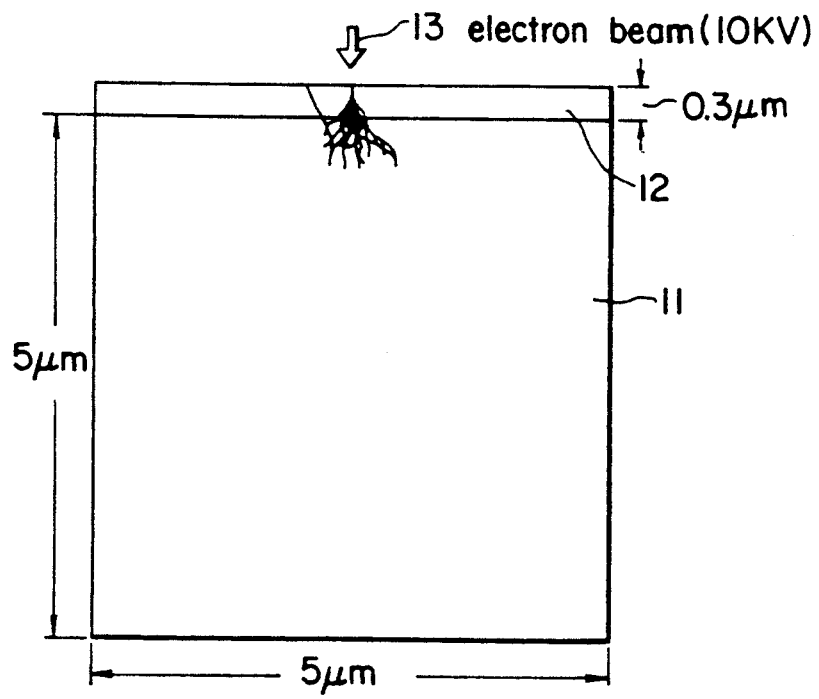
Figure 4A:
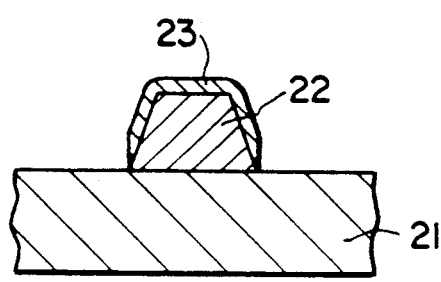
FIGS. 4A and 4B show coverage of a structure by resist material in the prior art.

Explanation is to be made for the example of the method of forming a fine pattern according to the present invention while referring to the drawings.

Figure 5:
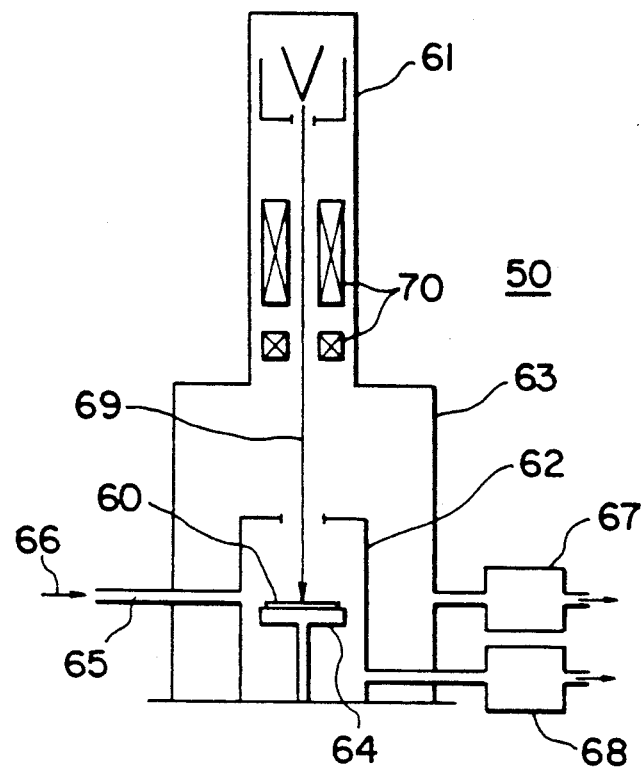
FIG. 5 shows a schematic illustration of an apparatus to deposit a resist layer according to the present invention.

FIG. 5 is a constitutional view for an apparatus used in the present invention. In the drawing, are shown an electron beam irradiation system 50, a specimen chamber 62 disposed within a chamber 63, a substrate 60 as a specimen disposed on a susceptor 64 in the specimen chamber 62, an exhaust system 67 for the chamber 63 and an exhaust system 68 for the specimen chamber 62. It is adapted such that starting material gas 66 is introduced by way of a pipeway 65 to the specimen chamber 62.

In this example, a gas containing a negative type resist (hydrocarbon) as a constituent material, for example, alkyl naphtalene is used as the starting material gas 66, which is introduced into the specimen chamber 62. The chamber 63 and the specimen chamber 62 are evacuated to the same extent of high vacuum. Alkyl naphthalene as the starting material gas is liquid in the atmospheric air but gasified under high vacuum. Further, since alkyl naphthalene as such has a low vapor pressure or large absorption coefficient, it causes no interaction with the substrate 60. The pressure of the starting material gas atmosphere in the specimen chamber 62 is about $10^{-5}$ Torr to $10^{-8}$ Torr and, usually, at about $10^{-7}$ Torr.

The temperature of the substrate is kept at an appropriate temperature within a range about from room temperature to $-30°$ C.

Then, when electron beams 69 at an acceleration voltage of 6 KV and a beam current of 20 $\mu$A are converged in a converging lens 70 and irradiated to a desired portion on the substrate 60 in the starting material gas atmosphere for 5 seconds, a resist is formed from the starting material gas and the resist film is deposited on the desired portion thereof. A resist film having satisfactory acid resistance is formed as a resist film.

Figure 6:
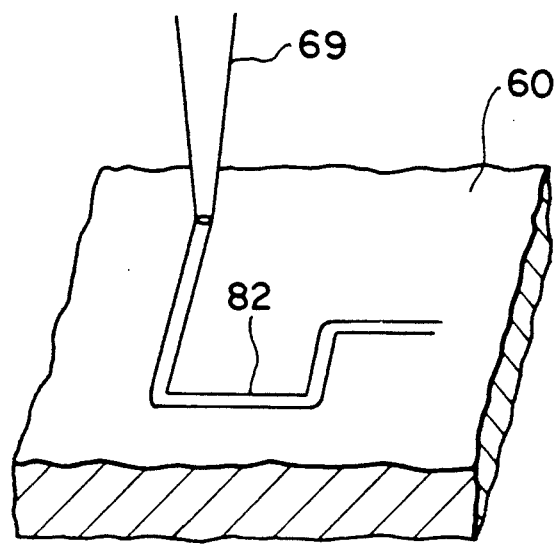
FIG. 6 is a perspective view illustrating the process of forming a patterned resist layer according to the present invention.

In this instance, since no solid material is used as the starting material for the resist, there is no multiple scattering in the resist and the recoil electrons due to the backward scattering from the substrate which are inevitable in case of using the solid resist which results in blur of the developed resist. A resolution up to about 250 Å is obtained at a so-called line and space, that is, for the stripe width and the space width between adjacent stripes when stripe-like resist layers are formed respectively, and it is possible to obtain a resolution of less than 100 Å by optimizing the acceleration voltage for the electron beams 69, etc. The lower limit for the value is kept by the sum of the blur of the electron beams (about 40 Å) and polymerization thickness of the hydrocarbon film (about several tens Å). Then, by scanning the electron beams 69 as shown in FIG. 6, a resist pattern 82 of less than 100 Å width is directly drawn on the surface of the substrate 60.

Figure 7:
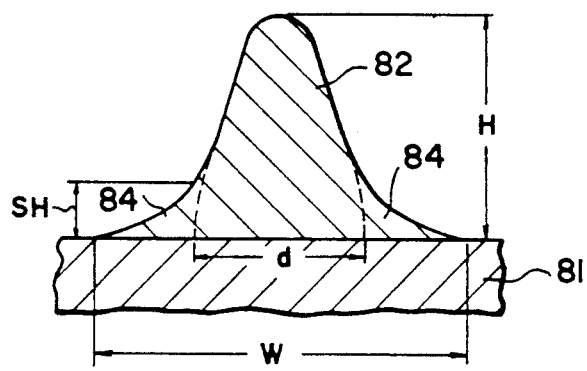
FIG. 7 is an enlarged cross-sectional view of the resist layer formed according to the present invention.

The resist layer thus formed has typically a shape as shown in FIG. 7, which shows the cross sectional view of the resist layer. The resist layer 82 formed on a substrate 81 has a height H and width W including skirt portions 84 with a height of SH.

In using the resist layer in semiconductor device manufacturing process, in some cases it is necessary to remove the skirt portion 84, and it is also necessary to remove the resist layer during or after the processing steps in manufacturing semiconductor device.

The etching of the resist layer can be carried out by applying reactive ion etching technique. In carrying out the reactive etching, a pair of electrodes is provided in a vacuum chamber. One electrode is grounded with the chamber and another electrode is applied with RF electrical power on which a substance to be etched is placed. There is introduced gas such as $CF_4$ or $CCl_2F_2$ which form plasma under the application of RF power to the electrode.

Removing whole resist layer, that is applying isotropic etching to the resist layer is made possible by applying reactive ion etching under the condition of a pressure larger than $(3 \times 10/L)$ Pa and electrical power larger than 0.3 W/cm$^2$, wherein L represents a distance between the electrodes.

While partially removing the exposed portions of the resist layer, that is applying anisotropic etching is made possible by applying reactive ion etching under the condition of a pressure less than $(3 \times 10/L)$ Pa and electric power less than 0.3 W/cm$^2$, wherein L represents a distance between the electrodes.

EXPERIMENT

The resist layer was deposited on a semiconductor substrate by using the apparatus explained above in connection with FIG. 5. The resist layer had a height of 4000 Å, a main bottom width d of 1000 Å, and a width w including the skirt portions of 6000 Å.

The resist layer thus formed was then subjected to reactive ion etching. The reactive ion etching apparatus has a pair of electrodes in a vacuum chamber each having 300 cm² of area disposed opposed to each other with a distance of 10 cm between the two electrodes. 5 cc of $CF_4$ and 45 cc of He gas was introduced and 300 W of electrical power was applied to an electrode on which the substrate having the resist layer thereon was placed, thus reactive ion etching was applied to the resist layer. The above condition means that the pressure was 9 Pa, or $(9 \times 10/L)$ Pa and the power density of 1 W/cm².

Figure 8:
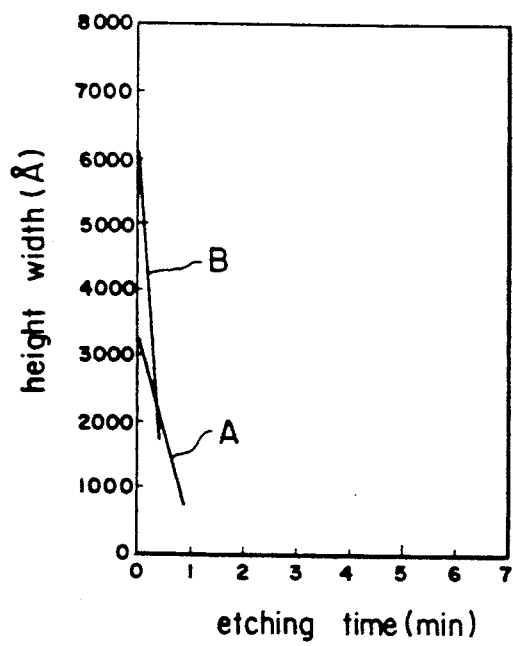
FIG. 8 is a graph showing the relation between the etching time and height and width of the resist layer under the condition to remove the resist layer.

The result is shown in FIG. 8, in which the curves A and B show the change of the height H and the width W of the resist layer respectively. It is understood from the result that both the height and the width were remarkably reduced with the elapse of time thus isotropic etching was applied to the resist layer.

Figure 9:
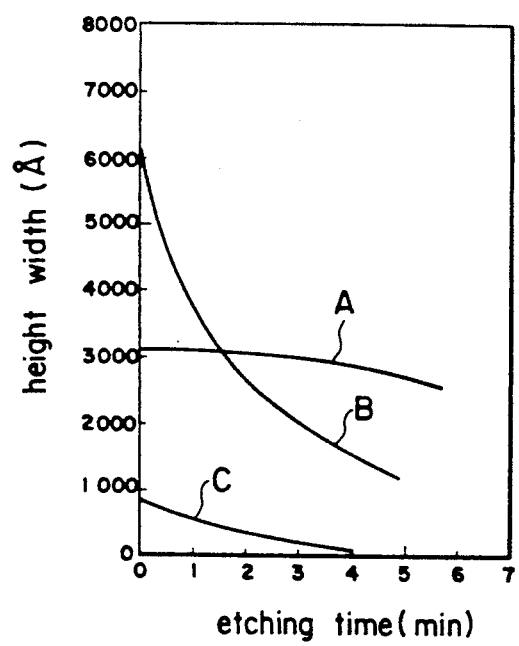
FIG. 9 is a graph showing the relation between the etching time and height and width of the resist layer under the condition to remove the skirt portion of the resist.

Next, in the same apparatus, a sample made by the same process as explained above was subjected to reactive ion etching under the condition by introducing 5 cc of $CF_4$ gas and applied electrical power of 30 W. In this condition, the pressure was 0.9 Pa, that is $0.9 \times 10/L$ Pa and power density was 0.1 W/cm². The result is shown in FIG. 9, in which the curves A, B and C show the change of the height H, the width W and the skirt portion height SH respectively. It is understood from the result that both the width W and the skirt portion height SH were remarkably reduced with the lapse of time, while the height H did not change substantially, thus the anisotropic etching was applied to the resist layer.

By selecting the proper conditions as described above, the resist can be easily removed during or after the fine pattern forming process, and it is possible to remove the unnecessary portion after forming a resist pattern, the resist pattern of a desired width can be obtained to obtain a mask of high resolution. Further the entire width of the resist pattern can also be narrowed to attain a sharp shape.

The method for forming fine pattern according to the present invention was applied for manufacturing GaAs MESFET.

Figure 10A:
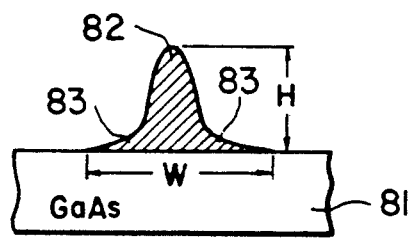
FIGS. 10A to 10F and 11A to 11E show the process steps of forming fine patterns using the patterned resist layer according to the present invention.

At first, a semiconductor substrate, for example, GaAs substrate 81 was disposed in the apparatus as described above with respect to FIG. 5, and electron beams 69 were irradiated to the substrate 81 in an alkyl naphthalene atmosphere to form a resist film 82 on the substrate 81 as shown in FIG. 10A. In this case, if the resolution is increased by optimizing the adjustment for the electron beams 69 and the irradiation period of the electron beam is increased, a resist film 82 in which the width d of the main bottom is about 1000 Å having a thin skirt-like portion 83 at the bottom and having film thickness H of about 4000 Å with the width d being decreased upwardly is formed.

Figure 10B:
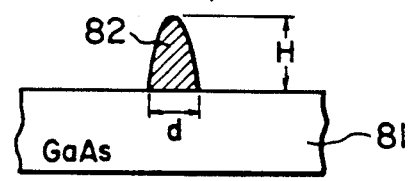
Figure 10C:
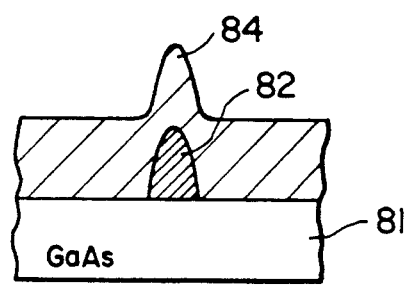

Then, as shown in FIG. 10B, the substrate 81 was disposed in a reactive ion etching device (not illustrated), to which 5 cc of $CF_4$ was sealed and the skirt portion 83 was removed by etching while applying 30 W between the opposing electrodes (10 cm distance) each with the area of the 300 cm². In this case, etching was applied under the condition of pressure at 0.9 Pa and the power density of 0.1 W/cm². Although the height H does not change substantially, along with the elimination of the skirt portion 83 the lateral direction W of the resist pattern 82 was entirely narrowed to obtain a sharp shape. Then, as shown in FIG. 10C, ohmic metal was vapor-deposited on the entire surface to form an ohmic metal layer 84.

Figure 10D:
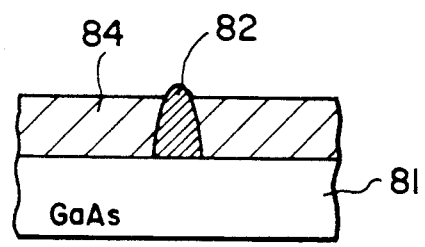

Then as shown in FIG. 10D, the ohmic metal layer 84 was subjected to an isotropic etching till a portion of the resist pattern 82 was exposed.

Figure 10E:
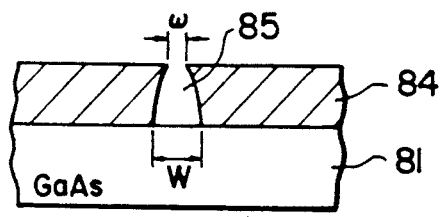

Then, as shown in FIG. 10E, only the resist pattern 82 was selectively removed by the reactive ion etching, under the condition of gas pressure of 9 Pa and applied power density of 1 W/cm². By the removal of the resist pattern 82, a cavity 85 was formed in the ohmic metal layer 84. The width w for the opening of the cavity 85 was about one-to-several fractions of the width d at the bottom.

Figure 10F:
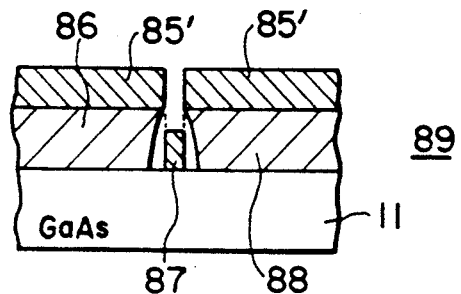

Then, as shown in FIG. 10F, Schottky metal was vapor deposited entirely to form a Schottky metal layers 85', 85', 87. Thus, a gate electrode 87 of the Schottky metal corresponding to the width w for the opening was formed on the substrate 81 between the source electrode 86 and the drain electrode 88 which are formed with the ohmic metal. According to the production method described above, a GaAs MESFET 89 with the source-drain distance of less than 1000 Å and the gate length of 200 Å can be obtained.

According to the method as described above, by forming a mask pattern of a first material by irradiating the surface of a substrate with charged particle rays in a starting gas material atmosphere, forming the second substance layer covering the mask pattern and, thereafter, selectively removing the mask pattern and then forming the third material on the substrate in the cavity from which the mask pattern has been removed using the second material layer as a mask, the third material layer of an extremely fine pattern can be formed. Accordingly, the method is particularly suitable when used for the production process of a semiconductor device such as a large scaled integrated circuit of microstructure.

The second method applied to manufacture GaAs MESFET will be explained with reference to FIG. 11.

Figure 11A:
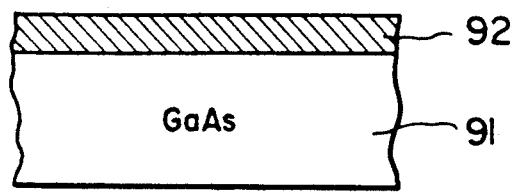
Figure 11B:
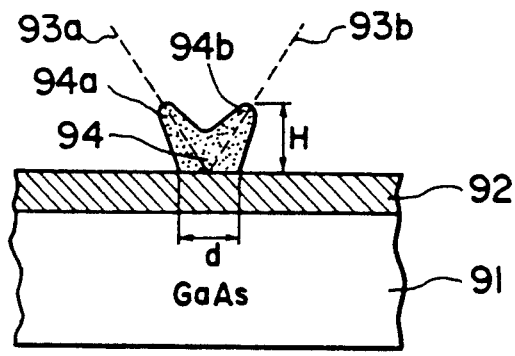

As shown in FIG. 11A, a Schottky metal layer 92 was formed over the GaAs substrate 91, it was disposed in the apparatus shown in FIG. 5 as described previously, and electron beams 93a and 93b were irradiated at the Schottky metal layer 92 from two directions in the alkyl naphthalene atmosphere, to form deposition products 94a, 94b by the respective electron beams 93a and 93b on the Schottky metal 92 and, as a result, there was formed a resist film 94 in which the width of the top was broader that of the base as shown in FIG. 11B. In this case, beam irradiation was conducted in the same way for two times while changing the irradiation direction of the electron beams by tilting the electron beams 93 or tilting the substrate 91. If the resolution is increased by optimizing the adjustment for the electron beams and the irradiation period of the electron beams is increased, a resist film 94, in which the width d of the base is about 1000 Å and each height H is of about 3000 Å is formed.

Then, if a thin skirt-like resist was formed on the side of the base, trimming is applied by RIE (reactive ion etching) to the skirt-like portion, although not illustrated in the drawing.

Figure 11C:
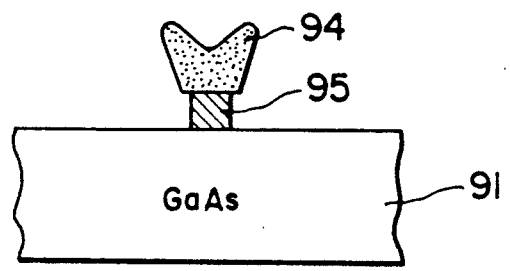
Figure 11D:
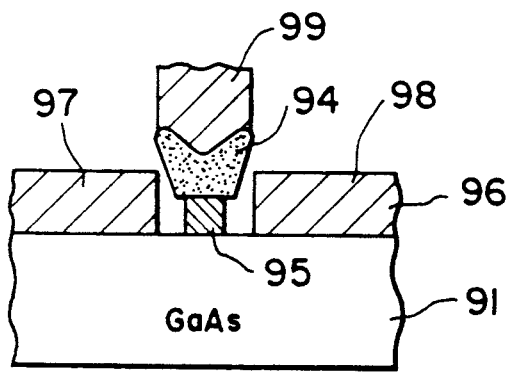

Then, as shown in FIG. 11C, the Schottky metal 92 was selectively removed by the wet etching using the resist film 94 as a mask to form a gate electrode 95.

Figure 11E:
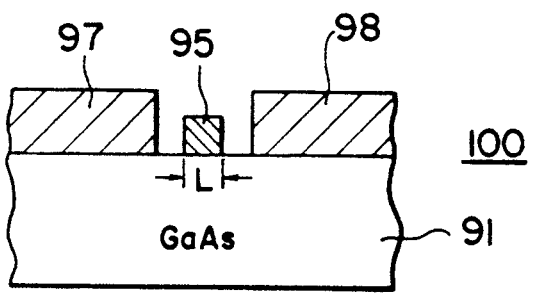

Then, the ohmic metal 97, 98, 99 was vacuum-deposited to cover the entire surface to form a source electrode 97 and a drain electrode 98 (FIG. 11D) and then the resist film 94 and the ohmic metal 99 thereon were removed together. Thus, a GaAs MESFET 100 with the gate length L of about several hundreds Å can be obtained as shown in FIG. 11E.

According to the method, upon depositing a product from a starting material gas along with a pattern by irradiating charged particle rays in a required pattern on a substrate in an atmosphere containing the starting gas material, a deposition product, that is, a resist film with the width at the top being broader than that at the base is formed by irradiating the charged particle rays from a plurality of directions. By utilizing the resist film as a pattern-forming mask, an extremely fine pattern can be formed by the self-alignment. Accordingly, this method is particularly suitable to the use for the production process of semiconductor devices such as large scale integrated circuits requiring microstructures.

The technique of directly forming a resist layer where the charged ray is irradiated is further applicable to cover an over-hung structure including side wall portion thereof which is applicable to form fine patterned structure in manufacturing semiconductor device.

Figure 12A:
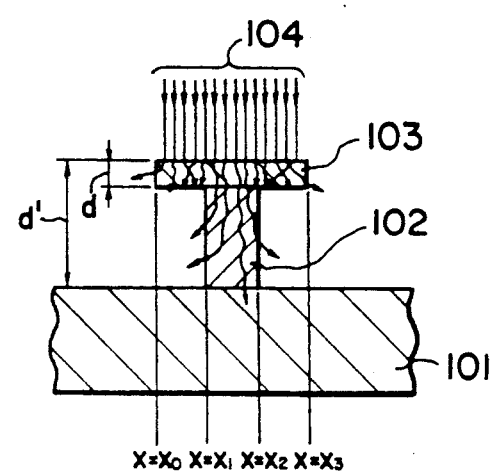
FIGS. 12A and 12B show the principle of forming a resist material over a side wall portion of a structure according to the present invention.
Figure 4B:
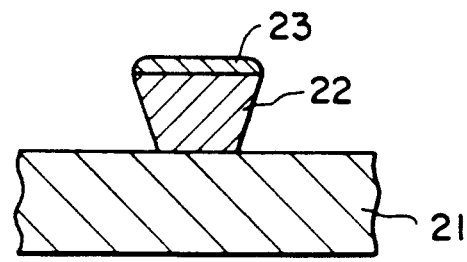
Figure 12B:
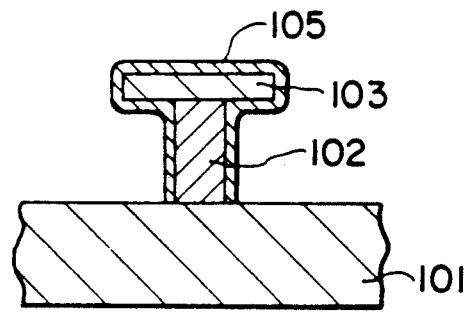

As shown in FIG. 12A, it is assumed here that an over-hung structure having a film 102 and another film 103 with a greater width than that of the film 102 is formed on a semiconductor substrate 101. Charged particle rays, for example, electron beam 104 is irradiated from the direction vertical to the surface of the semiconductor substrate 101 in an atmosphere containing a predetermined starting material gas. As the energy of electron beam 104, there are used such energy that the range of electrons in the film 103 is substantially equal with the thickness d of the film 103 within the range: $x_0 < x < x_1$ and $x_2 < x < x_3$, and such energy that the range of electrons in the films 102 and 103 are substantially equal with the total thickness d' for the films 102 and 103 within a range: $x_1 < x < x_2$. In this case, since the electrons entered in the overhung structure comprising films 102 and 103 are caused to multiple scattering in the inside thereof, the directionality of the electron beam 104 is made random by the effect of the multiple scattering and, as a result, the electron beam 104 is exited in random directions from the rear face of the film 103 and the side of the films 102 and 103. That is, in this case, the electron beam 104 is irradiated also to the portions forming shadows when viewed from the incident direction of the electron beam 104. As a result, as shown in FIG. 12B, the resist 105 made of material formed by the decomposition of the starting material gas under the irradiation of the electron beam 104 is formed to the entire surface of the over-hung structure. That is, the entire surface of the over-hung structure can be covered with the resist 105.

As is apparent from the description above, it is possible according to the foregoing means to cover the entire surface of the over-hung structure with the resist and, accordingly, the over-hung structure can be kept even if the isotropic etching is applied subsequently.

The above explained side wall protection by the resist layer is applied to the production of a GaAs MESFET.

FIGS. 13A to 13F are cross sectional views illustrating the method of producing a GaAs MESFET as one embodiment according to the present invention in the order of the steps.

Figure 13A:
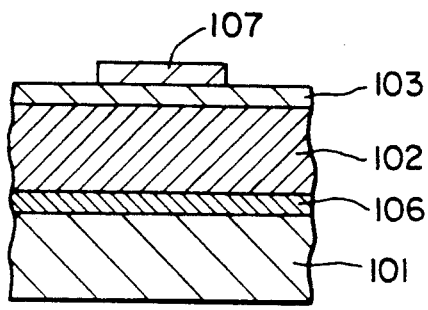
FIGS. 13A-13F show the process steps of using the resist structure of FIGS. 12A and 12B, and FIGS. 14, 15A and 15B show a method for manufacturing quasi one dimentional MESFET.

In this example, as shown in FIG. 13A, a film 106 of metal, for example, Al, a film 102 of metal, for example Mo or W and a film 103 of metal, for example, Al were successively formed to the entire surface of a semiconductor substrate 101 made of GaAs successively by means of vapor deposition or sputtering. The thickness for each of the films 103 and 106 is for example, from 50 to 100 Å, while the thickness of the film 102 is, for example, from 1000 to 2000 Å. Then, a starting material gas, for example, alkyl napthalene is introduced to the specimen chamber exhausted to a high vacuum degree of an electron beam irradiation apparatus as shown in FIG. 5 and electron beams were irradiated in a predetermined pattern on the film 103 in the starting material gas atmosphere. The energy of the electron beams is, for example, at 6 keV and the beam current is, for example, 20 μA. Further, the pressure of the starting material gas atmosphere is, for example, from $10^{-5}$ to $10^{-8}$ Torr and, usually, at $10^{-7}$ Torr. By the irradiation of the electron beams, carbonaceous material was formed from the starting material gas in the form of the irradiation pattern on the film 103, by which a resist 107 of a predetermined shape composed of the resultant material was formed on the film 103. The resist 107 can be made into an extremely fine width for instance, of less than 1000 Å.

Figure 13B:
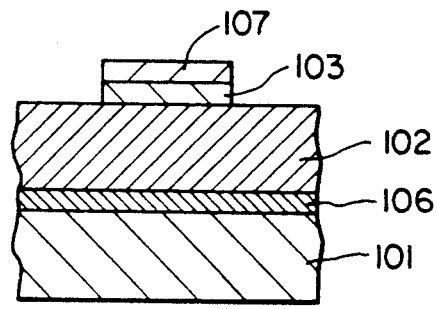

Then, by applying wet etching to the film 103 using an etching solution capable of selectively etching the film 103 to the film 102 while using the resist 107 as a mask, the film 103 was formed into an identical shape with the resist 107 as shown in FIG. 13B. In a case where the film 103 is an Al film, phosphoric acid ($H_3PO_4$) can be used, for example, as the etching solution.

Figure 13C:
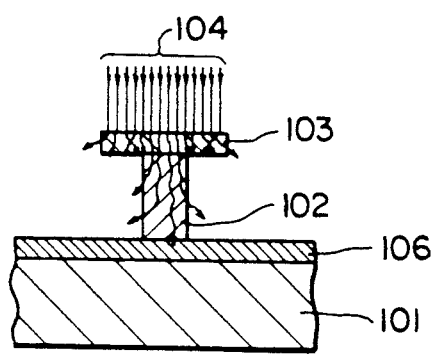
Figure 13D:
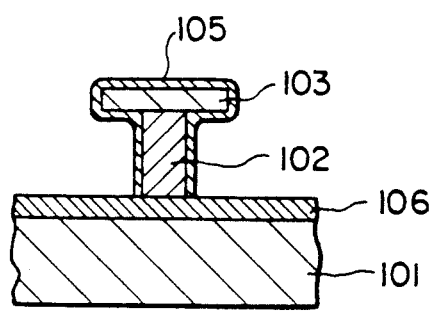

Then, the film 102 was etched, for example, by the reactive ion etching (RIE) by using the resist 107 and the film 103 as the mask. In this case, by properly selecting the etching conditions, the film 102 is side-etched to reduce the width as compared with that of the film 103 as shown in FIG. 13C, by which an over-hung structure comprising the films 102 and 103 is formed. In this etching, the resist 107 was removed by etching. In a case where the film 102 is a Mo film, $CF_4$ type gas can be used, for example, as the reactive gas for RIE.

Then, electron beam 104 was irradiated again to the over-hung structure comprising the films 102 and 103 in the starting material gas atmosphere, for example, alkyl naphthalene in the specimen chamber of the electron beam irradiation apparatus shown in FIG. 5. In a case where the thickness of the film 103 is, for example, about 100 Å and the thickness of the film 102 is, for example, about 200 Å, the energy of the electron beam 104 used is about 500 eV within the range : $x_0 < x < x_1$ and $x_2 < x < x_3$ and about 3 keV in the range : $x_1 < x < x_2$ in FIG. 12A. By the irradiation of the electron beam 104, a resist 105 comprising the carbonaceous material induced from the starting material gas was formed to the entire surface of the over-hung structure comprising the films 102 and 103 by the principle as described above as shown in FIG. 13D.

Figure 13E:
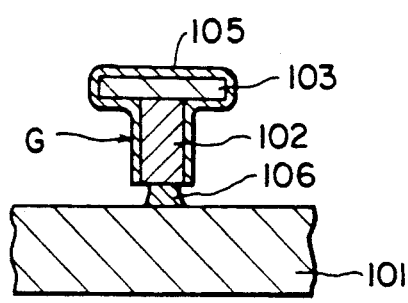

Then, an etching solution capable of selectively etching the film 106 was used the film 106 was wet-etched by using the over-hung structure covered with the resist 105 as a mask. In a case where the film 106 is an Al film, H₃PO₄ can be used, for example, as the etching solution as has been described above. By the etching, a gate electrode G comprising the films 106, 102 and 103 is formed as shown in FIG. 13E. In this case, the gate length Lg is determined by the width of the metal film 106 in contact with the semiconductor substrate 101.

Figure 13F:
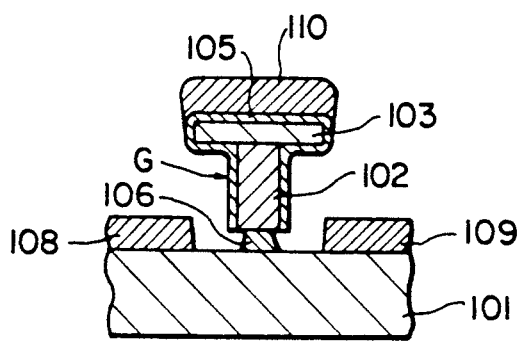

Then, the ohmic metal was vapor deposited over the entire surface. In this case, the over-hung portion of the over-hung structure comprising the films 102 and 103 act as a mask upon vapor deposition and, as a result, the source electrode 108 and the drain electrode 109 are formed in a self-aligned manner relative to the gate electrode G as shown in FIG. 13F. Thus, the GaAs MESFET is completed. Upon vapor deposition of the ohmic metal, the ohmic metal film 110 is also formed on the resist 105.

As has been described above according to this embodiment, since the entire surface of the over-hung structure can be covered with the resist 105 by irradiating the electron beam 104 to the over-hung structure comprising the films 102 and 103, it is possible to prevent the film 103 from being etched upon subsequent isotropic etching of the film 106 by the wet etching. Therefore, the over-hung structure comprising the films 102 and 103 can be kept as it is. Accordingly, the source electrode 108 and the drain electrode 109 can be formed in a self-aligned manner relative to the gate electrode G as described above by utilizing the over-hung structure. Further, since the film 106 of an extremely fine width can be formed by applying isotropic etching while using the over-hung structure covered with the resist 105 as a mask, the gate length Lg can be made extremely short. This can improve the mutual conductance $g_m$. Moreover, since the films 102 and 103 are formed on the film 106, the series resistance $R_g$ of the gate can be reduced, thereby obtaining satisfactory alternating current property.

As has been described above according to the method, since charged particle rays are irradiated to a pattern formed on a semiconductor substrate and having an over-hung structure in an atmosphere containing a predetermined starting material gas thereby forming the resist comprising the material formed from the starting material gas over the entire surface of the pattern, the entire surface of the over-hung structure can be covered with the resist and, accordingly, the over-hung structure can be kept as it is even if isotropic etching is applied subsequently.

The resist layer of the present invention is further applicable to make a very narrow channel width MESFET by using the resist layer as an etching mask for semiconductor layer.

Figure 14:
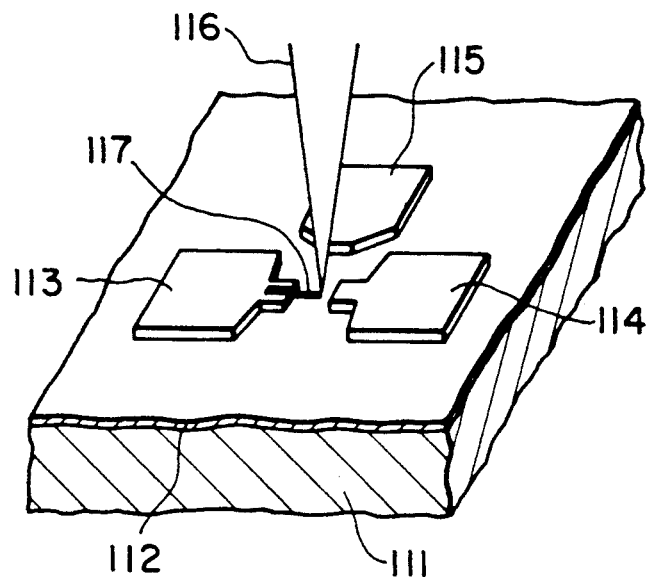
Figure 15A:
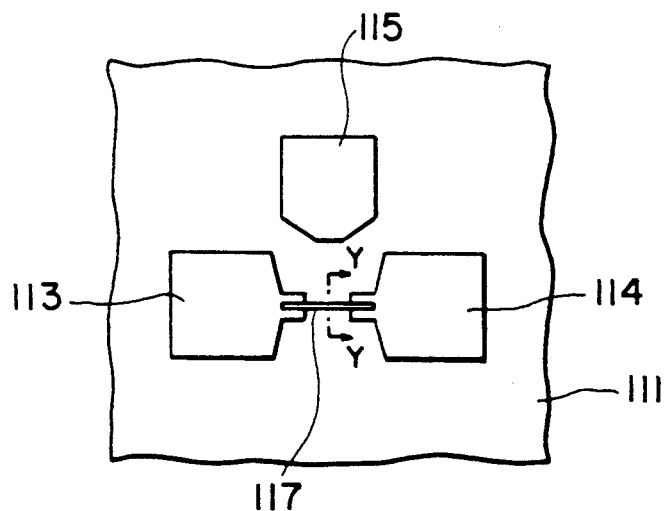
Figure 15B:
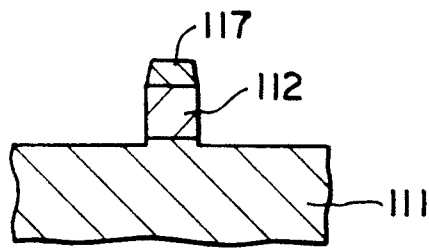

FIGS. 14, 15A and 15B show an example that the fine pattern forming technique of the present invention is applied to the quasi one-dimensional GaAs MESFET. As shown in FIG. 14, an n type GaAs channel layer 112 was formed on a semi-insulating GaAs substrate 111. On the channel layer 112, there are provided a source electrode 113, a drain electrode 114 and a gate electrode pad 115. The substrate 111 was placed in an apparatus shown in FIG. 5, and the electron beam 116 was irradiated and scanned from the source electrode 113 to the drain electrode 114 in the atmosphere containing alkyl naphthalene gas to form the resist layer 117 having a width of, for example, 500 Å. Then, selective etching to the n type GaAs layer was carried out by reactive ion etching under the condition containing CCl₂F₂ and H₂ with the gas flow rate of 20 cc/min and 50 cc/min and electrical power of 70 W. Under the condition, an etching rate for the resist was 100 Å/min, while an etching rate for the GaAs layer was 5000 Å/min. Thus the GaAs layer was selectively removed without damaging the resist layer leaving very narrow channel region under the resist layer as shown FIGS. 15A and 15B. The resist layer can be removed by the reactive ion etching under the condition described previously. Then a schottky metal is deposited to the entire surface, and a resist layer is deposited crossing the channel layer and the gate electrode pad 115. By using the resist layer as a mask, the schottky metal layer is removed to complete the quasi one-dimentional MESFET.

We claim:

1. A method for forming a fine pattern by using a patterned resist layer for use in manufacturing a semiconductor device comprising the steps of:
   (a) placing a substrate having a layer on which a patterned resist layer is to be formed in an evacuated chamber, said chamber containing a starting material gas to be deposited on said layer as a desired resist pattern,
   (b) directing a collimated charged particle ray on said layer from at least two directions and scanning along said desired pattern to form said patterned resist layer derived from said starting material gas, said patterned resist layer having a wider width at the top of said patterned resist layer than a width at the bottom of said patterned resist layer,
   (c) etching said layer by using said patterned resist layer as an etching mask to expose portions of the substrate, and
   (d) removing said patterned resist layer by reactive ion etching.

2. A method according to claim 1, said layer is a semiconductor layer.

3. A method according to claim 1, said substrate is a semiconductor substrate and said layer is a metal layer which forms schottky contact to said semiconductor substrate.

4. A method according to claim 3, further comprising a step of depositing a metal layer by using said patterned resist layer as a deposition mask, and said metal forms an ohmic contact with the exposed portion of said substrate.

5. A method for forming a fine pattern by using a patterned resist layer for use in manufacturing a semiconductor device comprising the steps of:
   a) placing a substrate having a first layer on which a patterned resist layer is to be formed in an evacuated chamber, said chamber containing a starting material gas to be deposited on said first layer as a desired resist pattern,
   b) directing a collimated charged particle ray on said first layer and scanning along said desired pattern to form said patterned resist layer derived from said starting material gas,
   c) forming a metal layer over any uncovered portions of said first layer on said substrate and said patterned resist layer,
   d) removing said patterned resist layer by reactive ion etching to exposed surface portions of the first layer free of the metal layer, and then
   e) depositing a third layer on the exposed surface portions of the first layer with the metal layer being a deposition mask.

6. A method according to claims 1 or 5, said reactive ion etching is carried out under the condition that gaseous pressure is larger than $(3\times 10/L)$ Pa and electrical power density is larger than $0/3$ W/cm$^2$, wherein L represents a distance between a pair of electrodes.

7. A method according to claim 5, wherein said substrate is formed of semiconductor material and said metal forms an ohmic contact to said substrate.

8. A method according to claim 7, wherein the step of depositing a third layer applies another metal which forms a schottky contact with said substrate.

9. A method for forming a fine pattern by using a patterned resist layer comprising the steps of:
 a) placing a substrate having a first layer on which a patterned resist layer is to be formed in an evacuated chamber, said chamber containing starting material gas to be deposited on said first layer as a desired resist pattern,
 b) directing a collimated charged particle ray on said first layer and scanning along said desired pattern to form said patterned resist layer derived from said starting material gas,
 c) applying a first reactive ion etching process to said patterned resist layer under such condition that a skirt portion of said patterned resist layer adjacent to said first layer is removed,
 d) forming a metal layer over said first layer on said substrate and said patterned resist layer,
 e) removing said patterned resist layer by a second reactive ion etching process to create exposed portions of the first layer, and then
 f) applying a third layer on the exposed portions of the first layer with the metal layer being a deposition mask.

10. A method according to claim 9, said first reactive ion etching process is carried out under the condition that gaseous pressure is less than $(3\times 10/L)$ Pa and electrical power density is less than 0.3 W/cm$^2$, wherein L represents a distance between a pair of electrodes.

11. A method according to claim 9, wherein said third layer is a semiconductor layer.

12. A method for forming a fine pattern by using a patterned resist layer comprising the steps of:
 (a) providing a substrate with a first and second layer;
 (b) removing portions of the first layer to form a pattern layer with surfaces on the second layer;
 (c) placing the substrate with the patterned layer in an evacuated chamber, said chamber containing a starting material gas to be deposited on said patterned layer;
 (d) directing a collimated charged particle ray on said patterned layer and scanning along said patterned layer to form a resist layer induced from said starting material gas on the surfaces of the patterned layer;
 (e) etching exposed portions of the second layer with the resist layer forming an etching mask to expose portions of the substrate, then
 (f) applying a third layer of material on the resist layer and exposed portion of the substrate.

13. A method according to claims 12, 1, 5 or 9, said charged particle ray is an electron beam.

14. A method according to claims 12, 1, 5 or 9, said evacuated chamber contains said starting material gas of $10^{-5} \sim 10^{-8}$ Torr.

15. A method according to claims 12, 1, 5 or 9, said starting material gas is hydrocarbon gas.

* * * * *